(12) United States Patent
Aksit et al.

(10) Patent No.: US 8,085,041 B2
(45) Date of Patent: Dec. 27, 2011

(54) THREE-POINT METHOD AND SYSTEM FOR FAST AND ROBUST FIELD MAPPING FOR EPI GEOMETRIC DISTORTION CORRECTION

(75) Inventors: Pelin Aksit, Cromwell, CT (US); John Andrew Derbyshire, Silver Spring, MD (US)

(73) Assignees: General Electric Company, Schenectady, NY (US); The United States of America as represented by the Secretary of the Office of Technology Transfer, National Institute of Health, Washington, DC (US)

( * ) Notice: Subject to any disclaimer, the term of this patent is extended or adjusted under 35 U.S.C. 154(b) by 431 days.

(21) Appl. No.: 12/100,811

(22) Filed: Apr. 10, 2008

(65) Prior Publication Data

US 2009/0256567 A1    Oct. 15, 2009

(51) Int. Cl.
  *G01V 3/00*    (2006.01)
(52) U.S. Cl. .................. 324/307; 324/309; 324/318
(58) Field of Classification Search ......... 324/300–322; 600/407–435; 382/128–131
See application file for complete search history.

(56) References Cited

U.S. PATENT DOCUMENTS

| | | | | |
|---|---|---|---|---|
| 4,599,565 A * | 7/1986 | Hoenninger et al. | ......... | 324/309 |
| 4,661,775 A * | 4/1987 | Kormos et al. | ......... | 324/307 |
| 4,720,679 A * | 1/1988 | Patrick et al. | ......... | 324/309 |
| 4,797,615 A * | 1/1989 | Rotem et al. | ......... | 324/309 |
| 5,099,208 A * | 3/1992 | Fitzpatrick et al. | ......... | 324/312 |
| 5,262,725 A * | 11/1993 | Cuppen et al. | ......... | 324/312 |
| 5,539,316 A * | 7/1996 | Sukumar | ......... | 324/320 |
| 5,742,163 A * | 4/1998 | Liu et al. | ......... | 324/309 |
| 6,275,037 B1 * | 8/2001 | Harvey et al. | ......... | 324/309 |
| 6,275,038 B1 | 8/2001 | Harvey | | |
| 6,664,787 B2 * | 12/2003 | Miyoshi et al. | ......... | 324/307 |
| 6,697,507 B1 * | 2/2004 | Chapman | ......... | 382/131 |
| 6,850,061 B2 * | 2/2005 | Stoyle | ......... | 324/306 |
| 7,154,269 B1 * | 12/2006 | Haacke et al. | ......... | 324/307 |
| 7,196,518 B2 * | 3/2007 | Yatsui et al. | ......... | 324/307 |
| 2002/0047708 A1 * | 4/2002 | Miyoshi et al. | ......... | 324/307 |
| 2004/0010191 A1 * | 1/2004 | Yatsui | ......... | 600/410 |
| 2004/0012390 A1 * | 1/2004 | Stoyle | ......... | 324/307 |
| 2007/0219442 A1 * | 9/2007 | Aletras et al. | ......... | 600/410 |

(Continued)

OTHER PUBLICATIONS

Chen et al., "Correction for EPI Distortions Using Multi-Echo Gradient-Echo Imaging," Magnetic Resonance in Medicine, vol. 41, pp. 1206-1213, 1999.

(Continued)

*Primary Examiner* — Melissa Koval
*Assistant Examiner* — Tiffany Fetzner
(74) *Attorney, Agent, or Firm* — Ziolkowski Patent Solutions Group, SC

(57) ABSTRACT

A system and method for MR magnetic field mapping includes a computer programmed to acquire a first data point at a first location in a first phase image data set, a second data point at the first location in a second phase image data set, a third data point at the first location in a third phase image data set. The first, second, and third phase images are acquired using a first, second, and third TE, respectively. Phase wrapping does not occur among the first and second phase image data sets; however, phase wrapping does occur among the second and third phase image data sets. The computer is also programmed to determine a magnetic field inhomogeneity, wherein the determination of the magnetic field inhomogeneity is based on the first, second, and third data points.

22 Claims, 3 Drawing Sheets

U.S. PATENT DOCUMENTS

| | | | | |
|---|---|---|---|---|
| 2008/0187196 | A1* | 8/2008 | Hu et al. | 382/128 |
| 2009/0230957 | A1* | 9/2009 | Park | 324/307 |
| 2009/0256567 | A1* | 10/2009 | Aksit et al. | 324/312 |
| 2009/0312625 | A1* | 12/2009 | Du | 600/410 |
| 2011/0152668 | A1* | 6/2011 | Stemmer | 600/413 |

OTHER PUBLICATIONS

Zeng et al., "Image Distortion Correction in EPI: Comparison of Field Mapping With Point Spread Function Mapping," Magnetic Resonance in Medicine, vol. 48, pp. 137-146, 2002.

Roopchansingh et al., "Single-Shot Magnetic Field Mapping Embedded in Echo-Planar Time-Course Imaging," Magnetic Resonance in Medicine, vol. 50, pp. 839-843, 2003.

Voss et al., "Fiber tracking in the cervical spine and inferior brain regions with reversed gradient diffusion tensor imaging," Magnetic Resonance in Medicine, vol. 24, pp. 231-239, 2006.

Chen et al., "Application of k-space energy spectrum analysis to susceptibility field mapping and distortion correction in gradient-echo EPI," NeuroImage, 2006.

Jezzard et al., "Correction for Geometric Distortion in Echo Planar Images from Bo Field Variations," MRM, vol. 34, pp. 65-73, 1995.

Lee et al., "Three-Point Phase-Contrast Velocity Measurements with Increased Velocity-to-Noise Ratio," MRM, vol. 33, pp. 122-126, 1995.

Reber et al., "Correction of Off Resonance-Related Distortion in Echo-Planar Imaging Using EPI-Based Field Maps," MRM, vol. 39, pp. 328-330, 1998.

Lucas et al., "Diffusion Imaging in the Presence of Static Magnetic-Field Gradients," Journal of Magnetic Resonance, Series A 104, pp. 273-282, 1993.

* cited by examiner

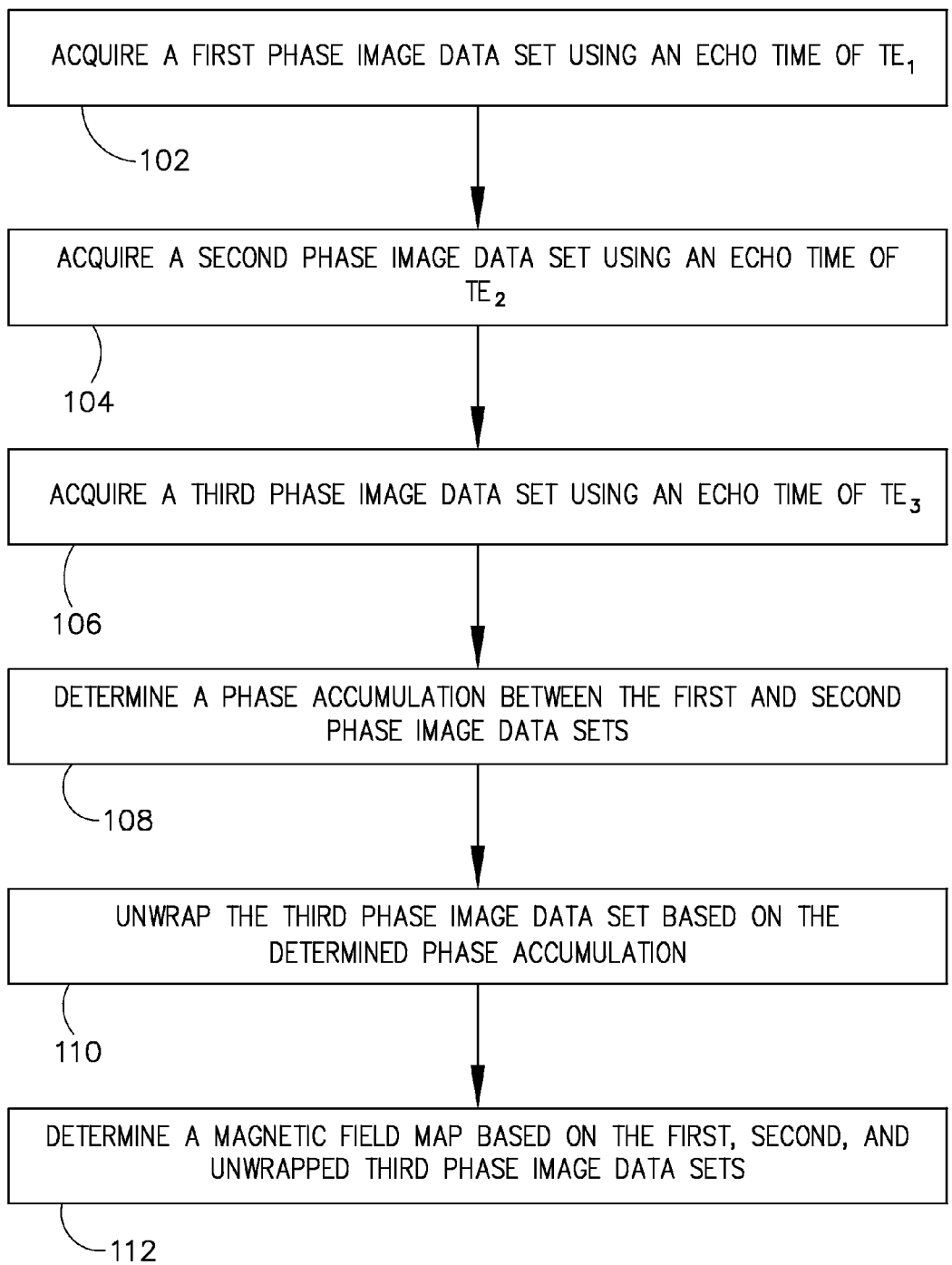

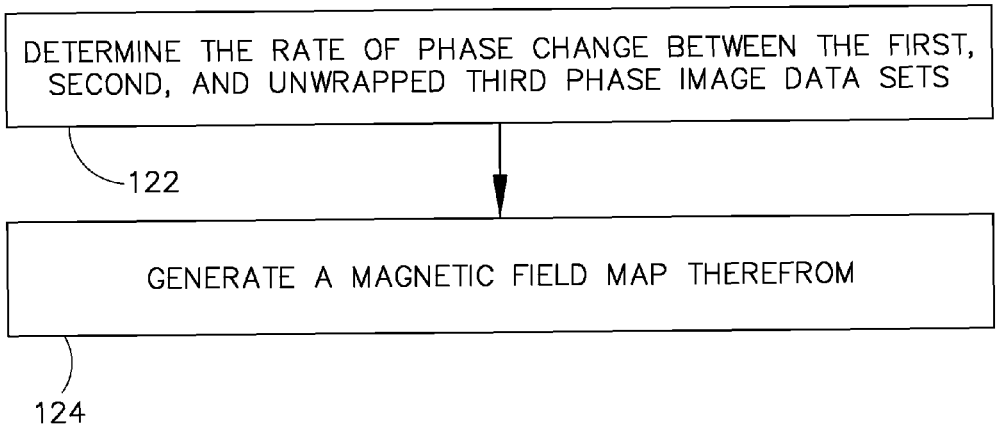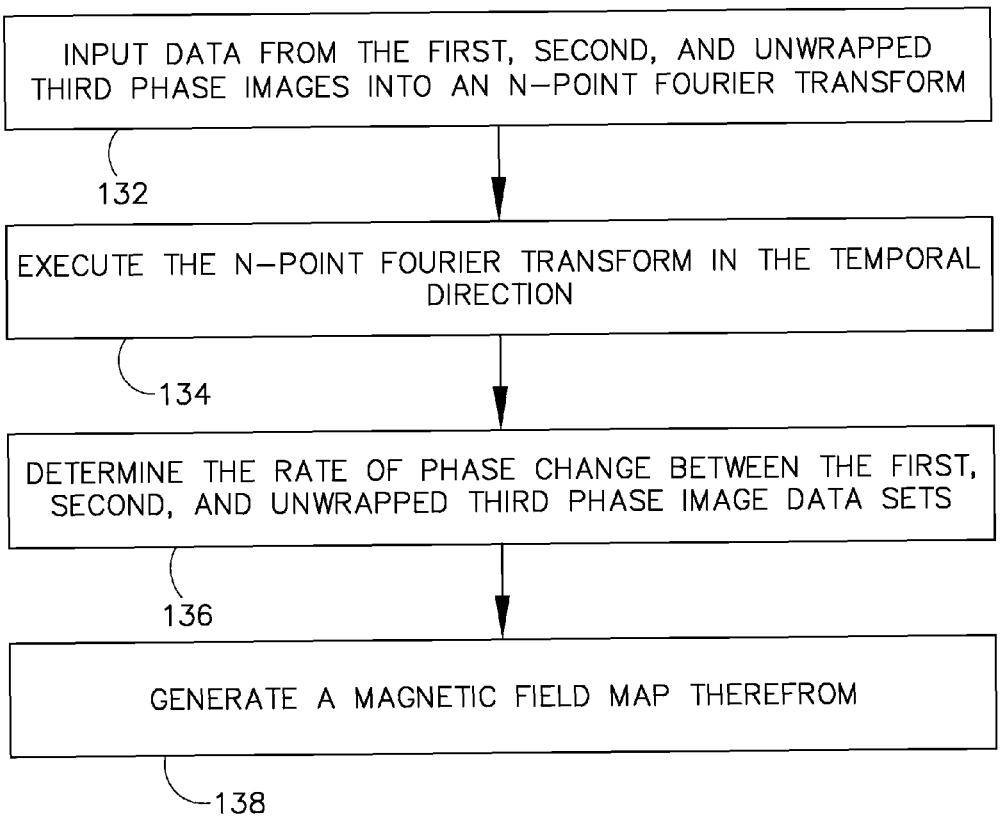

THREE-POINT METHOD AND SYSTEM FOR FAST AND ROBUST FIELD MAPPING FOR EPI GEOMETRIC DISTORTION CORRECTION

BACKGROUND OF THE INVENTION

The present invention relates generally to a three-point method and apparatus for efficiently creating robust magnetic field maps of a region-of-interest (ROI).

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Often, conventional magnetic resonance (MR) imaging acquires a small number of lines of k-space data after each RF excitation. The excitations are then repeated many times in order to cover k-space. With echo planar imaging (EPI), however, the complete k-space is acquired using a train of gradient recalled echoes that follow a single RF excitation. Such an acquisition sequence, however, often results in a longer readout period compared to other conventional sequences. In addition, EPI often results in low bandwidth per pixel in the phase encoding direction, making EPI more susceptible to artifacts in this direction. Further, off-resonance effects from local and main field inhomogeneities often cause phase accumulations over the longer readout periods of EPI.

The above-mentioned effects are spatially varying. As a result, geometric distortions often arise. For example, image voxels may be distorted through compression or stretching, depending on the local field gradients that they experience. This distortion causes the voxels to appear in the wrong place. As such, signal intensity may be either darker or brighter than it would be without the voxel distortion. The effects of these geometric distortions, which often scale linearly with main field strength, are prominent near paranasal sinuses, anterior orbits, the skull base, the liver-lung interface, air containing bowel loops, and other regions. Not only do the distortions have a negative impact on EPI data sets, they often hinder accurate registration of EPI data sets with functional information (e.g., BOLD) or structural information (e.g., white matter tracts) to anatomically correct non-EPI data sets.

Numerous techniques have been proposed to correct for geometric distortion. These techniques include the field mapping techniques, multi-reference techniques (such as multi-echo or PSF mapping), reversed gradient techniques, real-time techniques, and post-processing techniques. Each of these techniques, however, has their own drawbacks. For example, the multi-reference techniques typically measure distortion accurately; however, they require long acquisition times. Reversed gradient techniques, which acquire each data set twice in opposite directions to deduce the translation and intensity correction, are susceptible to noise in the data and often suffer from streaking artifacts. To serve as yet another example, real-time or single-shot techniques measure phase differences between multiple acquisitions following a single RF pulse; however, their resolution is limited by signal decay, especially at high fields.

The most commonly used correction technique has been field mapping, which measures variations in the magnetic field to calculate local pixel shifts in the image. The magnetic field map at each pixel is calculated from the slope of phase accumulation over time. In other words, the slope of phase accumulation between common points or pixels in two or more phase images is determined so that the magnetic field inhomogneities can be calculated. As such, a magnetic field map of a region of interest can be generated pixel by pixel. There are two main approaches to field mapping. The first approach acquires two phase images at different echo times, and then calculates a field map from the phase difference between these two phase images. If these two echo times are far apart, the range of phase accumulation between the two phase images may exceed $2\pi$, thus causing phase wrapping in one of the phase images. In such an instance, phase unwrapping is needed. Phase unwrapping, however, can be problematic at disconnected and high susceptibility regions. On the other hand, if the two echo times are selected close to each other in order to avoid the need for phase unwrapping, the slope measurements are strongly influenced by the noise in the phase measurements. As such, multiple excitations are typically used to increase a signal-to-noise ratio (SNR) so that a more accurate magnetic field map may be obtained. The second approach entails the acquisition of a series of phase images, e.g., sixteen phase images, at different echo times, where the echo times are chosen such that phase wrapping between successive phase images does not occur. A line is then fit to the phase accumulation over time present in the phase images and the field map is calculated from the slope of the fit. The produced magnetic field maps may be robust; however, the time needed for mapping is increased due to the quantity of images acquired. Accordingly, efficiently obtaining a robust field map continues to be challenging.

It would therefore be desirable to have a system and method capable of calculating or creating a robust magnetic field map that minimizes the amount of time need to do so.

BRIEF DESCRIPTION OF THE INVENTION

In accordance with one aspect of the invention, an MR imaging apparatus includes a magnetic resonance imaging (MRI) system having a plurality of gradient coils positioned about a bore of a magnet, an RF transceiver system and an RF switch controlled by a pulse module to transmit RF signals to an RF coil assembly to acquire MR images, and a computer. The computer is programmed to acquire a first data point at a first location in a first phase image data set, a second data point at the first location in a second phase image data set, a third data point at the first location in a third phase image data set. The first phase image data set is acquired at a first echo time (TE). The second phase image data set is acquired at a second TE such that phase wrapping does not occur among the first and second phase image data sets. The third phase image data set, however, is acquired at a third TE such that phase wrapping occurs among the second and third phase image data sets. The computer is also programmed to determine a magnetic field inhomogeneity, wherein the determination of the magnetic field inhomogeneity is based on the first, second, and third data points.

In accordance with another aspect of the invention, computer readable storage medium having stored thereon a computer program comprising instructions which when executed by a computer cause the computer to locate a first point in a first phase image, a second point in a second phase image, and a third point in a third phase image. The first phase image was acquired using a first TE, the second phase image was acquired using a second TE, and the third phase image was acquired using a third TE. The first, second, and third point locations are substantially equal. In addition, there is no phase wrapping between the first and second phase images. However, there is phase wrapping in the third phase image. The computer readable storage medium has further instructions to cause the computer to determine, and store in computer memory, a magnetic field inhomogeneity of a point in a region of interest that corresponds with the first, second, and third point locations.

In accordance with yet another aspect of the invention, a method of determining phase accumulation among magnetic resonance phase images includes acquiring a first phase image using a first TE time and a second phase image at a second TE such that a first phase accumulation between the first and second phase images is greater than or equal to negative $\pi$ and less than $\pi$. The method further includes the step of acquiring a third phase image at a third TE such that a second phase accumulation between the second and third phase images is one of greater than or equal to $\pi$ and less than negative $\pi$. The method also includes locating a first point from the first phase image, a second point from the second phase image, a third point from the third phase image, each substantially in a same location, and generating a magnetic field map based on a cumulative phase accumulation over the first and second phase images and an unwrapped third phase image. Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIG. 2 is a flowchart depicting a three-point field mapping technique according to an embodiment of the invention.

FIG. 3 is a flowchart depicting an embodiment of the invention

FIG. 4 is a flowchart depicting an embodiment of the invention.

DETAILED DESCRIPTION OF THE PREFERRED EMBODIMENT

Figure 1:
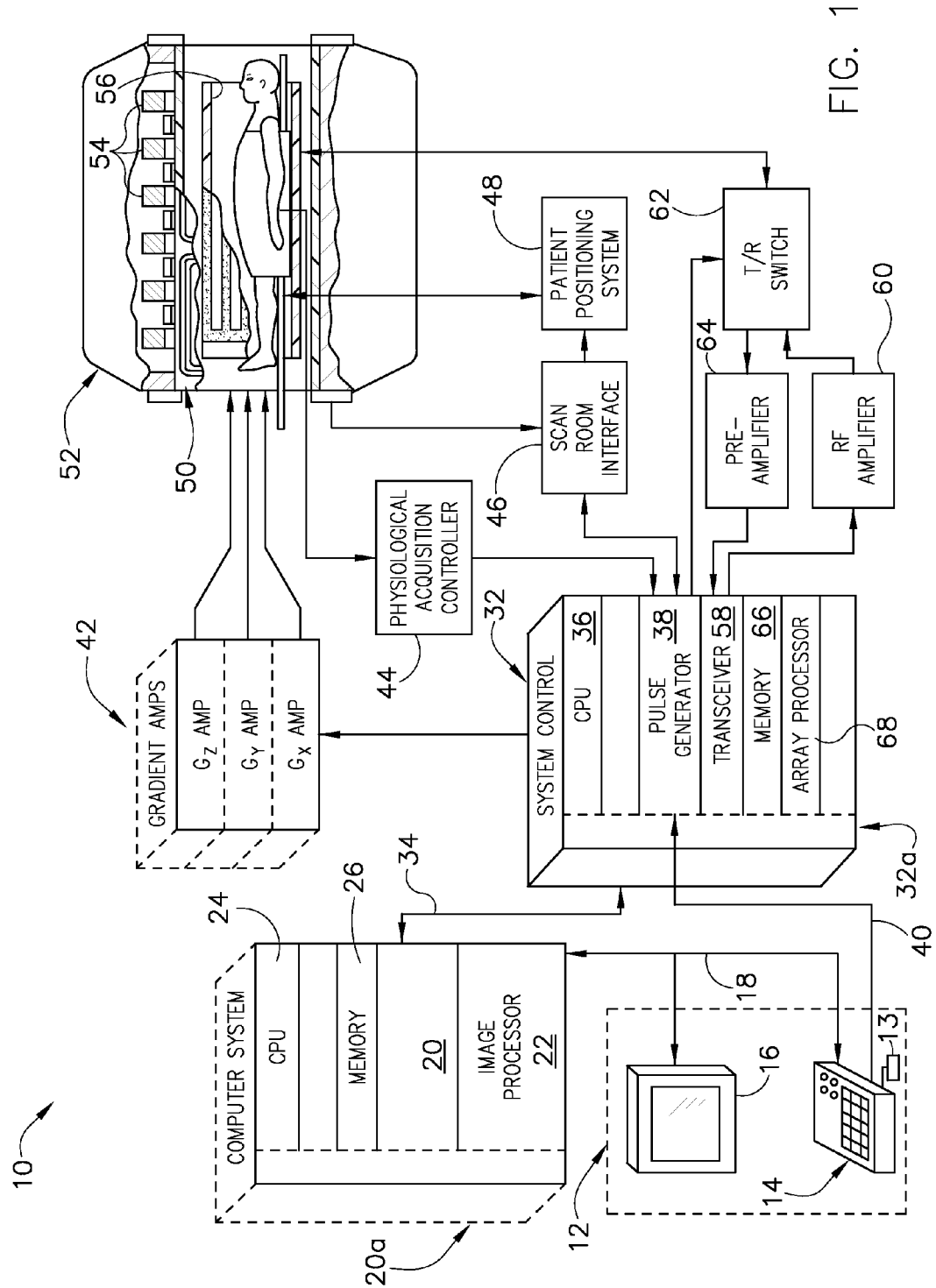
FIG. 1 is a schematic block diagram of an exemplary MR imaging system for use with embodiments of the invention.

Referring to FIG. 1, the major components of an exemplary magnetic resonance imaging (MRI) system 10 incorporating embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the multi-channel RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Referring to FIG. 2, a flowchart depicts a three-point magnetic field mapping technique according to an embodiment of the invention. Technique 100 provides for the determination of magnetic field inhomogeneities at points in an ROI such that a magnetic field map can be created therefrom, which may be used to correct for distortions during EPI.

Technique 100 begins, at STEP 102, with an acquisition of a first phase image data set from an ROI, where an echo time of $TE_1$ is employed during the phase imaging procedure. A second phase image data set from the ROI is acquired utilizing a different echo time, $TE_2$, at STEP 104. The echo time, $TE_2$, employed during the acquisition of the second phase image data set is chosen such that phase wrapping does not occur (i.e., phase accumulation is greater than or equal to negative π and less than π) among the first and second phase image data sets. In an alternate embodiment, phase accumulation is restricted to a range greater than the quantity negative π plus "e" and less than the quantity π minus "e." In such an instance, "e" is a small positive value (e.g., three times the standard deviation).

It will be understood by those skilled in the art that the data points sharing a common location, though in different phase images, correspond with a point or location in the ROI. In other words, the data that corresponds with each common data point location are elicited from a common location in the ROI. Furthermore, it will be understood by those skilled in the art that the terms "phase image" and "phase image data set" can be used interchangeably.

Still referring to FIG. 2, a third phase image data set is acquired using another echo time, $TE_3$, at STEP 106. The echo time, $TE_3$, employed during the acquisition of the third phase image data set is chosen such that a phase wrapping does occur (i.e., a phase accumulation greater than or equal to π or less than negative π) in the third phase image data set relative to the first and/or second phase image data sets. At STEP 108, a phase accumulation between the first and second phase image data sets is determined. The phase accumulation is determined on a point-by point basis. As such, in one embodiment, simply determining the differences in phase between a first data point of the first phase image data set and second data point of the second phase image data set, where the data from each point was elicited from a common location in the ROI, will determine the phase accumulation between the two points. By repeating the process on a point-by-point basis where phase accumulations occur, the phase accumulation between corresponding points in the first and second phase image data sets is determined.

Data in the third phase image data set is then unwrapped at STEP 110 using the phase accumulation determined at STEP 108. In a similar manner to STEP 108, the unwrapping of the third phase image data set is done on a point-by-point basis. For example, the determined phase accumulation between data points one and two, above, is used to unwrap the phase of a third data point in the third phase image data set, where the third data point shares a location common to data point one and two. Step 110 can then be repeated for other data points of the third phase image data set such that all or substantially all of such data points in the third phase image data set where phase accumulation is less than negative π or greater than or equal to π are unwrapped.

In another embodiment, the unwrapping of the phase of the third phase image data set can be accomplished by utilizing the following relationship:

$$k = \text{round}\left[(\arg(\phi_2\phi_1^*)(n\text{steps}) - \arg(\phi_3\phi_1^*))/2\pi\right] \quad (\text{Eqn. 1}),$$

where $\phi_1$ is the phase at the first data point, $100_2$ is the phase at the second data point, and $\phi_3$ is the wrapped phase at the third data point. In the above expression, the data points, along with their respective phases, share a common location in the ROI. The term "nsteps" is a value without units that represents the value of the echo time difference between the first and third data points in relation to the value of the echo time difference between the first and second data points. For illustrative purposes, take three data points where the respective imaging procedures utilized the exaggerated echo times of $TE_1$, $TE_2$, and $TE_3$, where:

$TE_1 = 1s$, $TE_2 = 2s$, and $TE_3 = 16s$.

In such an example, the term nsteps is equal to $(16-1)/(2-1) = 15$. Accordingly $2\pi k$ plus the phase of the third data point, $\phi_3$, is equivalent to the unwrapped phase of the third data point. This sum, the unwrapped phase of the third data point, can be considered a fourth data point. As will be understood by those skilled in the art, such a process can be repeated for each set of common points in the phase image data sets.

With the determined unwrapped phase of data points in the third phase image data set and the phases associated with the first and/or second phase image data sets, a magnetic field map of the ROI is determined at STEP 112. One skilled in the art will appreciate that a magnetic field inhomogeneity is first determined at each point and is used to determine the magnetic field map of the ROI. As such, each determined magnetic field inhomogeneity is preferably stored on computer memory such that it is accessible at a later time. Again, as with the determination of phase accumulation and the unwrapping of STEPS 108-110, the magnetic field map of the ROI is determined on a point-by-point basis. As such, it is contemplated technique 100 need not be performed over full data sets. That is, technique 100 could be performed for only a portion of the first, second, and third phase image data sets. Further, it is contemplated that the acquired first, second, and third phase image data sets are consecutive. That is, due to the robustness of technique 100 it is contemplated that the first, second, and third phase image data sets are acquired without intervening phase image data sets (i.e., data sets acquired at echo times therebetween $TE_1$, $TE_2$, and $TE_3$); thus, increasing the efficiency of the technique.

As shown in an embodiment 120 depicted in the flowchart of FIG. 3, a rate of phase change among the first, second, and unwrapped third data points, described above with respect to FIG. 2, can be used to determine a field inhomogeneity at a particular location in an ROI. This field inhomogeneity, which is proportional to phase accumulation among a set of points, can be used to generate a magnetic field map. In the embodiment 120 depicted in FIG. 3, a rate of phase change between the first and second data points and the unwrapped phase of the third data point is determined at STEP 122. Such a determination can be accomplished in several ways. In one embodiment, a representative best fit line could be used among the unwrapped phase of the third data point and the phase associated with the first and second data points. A determination of the slope of such a line would determine the rate of phase change among those points. In another embodiment, a representative line could be placed among the first data point and the unwrapped phase of the third data point. Again, the slope of such a line represents the rate of phase change among the first, second, and unwrapped third data points. In yet another embodiment, the slope of a line among the second data point and the unwrapped third data point would determine the representative rate of phase change among the first, second, and unwrapped third data points. The determined rate of phase change, or rate of phase accumulation, is related to a magnetic field inhomogeneity at a location in an ROI that is associated with the first, second, and unwrapped third data points. As such, the magnetic field map can be generated for each data point location based on the rate of phase accumulation at STEP 124. In other words, the cumulative phase accumulation found over the data points can be used to generate the magnetic field map.

Further, one skilled in the art will also understand that the rate of phase change determined at STEP 122 and the magnetic field generated at STEP 124 could be accomplished in one step. For example, the following relationship could be utilized:

$$\Delta B = \arg(\phi_{3 unwrapped}\phi_1^*)/(2\pi \cdot \gamma \cdot nsteps \cdot \Delta TE) \quad \text{(Eqn. 2)}.$$

As seen in Eqn. 2, the slope and the magnetic field are determined in one step. As discussed above, one skilled in the art will appreciate that the generation of the magnetic field map may be accomplished on a point-by-point basis. Further, one skilled in the art will appreciated that the magnetic field map may be generated in such a manner as to map only a portion of an ROI.

Referring now to FIG. 4, a flowchart depicts an embodiment 130 utilizing an N-Point Fourier Transform in the temporal direction such that a magnetic field map can be generated therefrom. Again, first, second, and unwrapped third data points sharing a common location are used to determine the magnetic field. Starting at STEP 132, data is input into an N-Point Fourier Transform, with inputs comprising zero-padding, zero-filling, and the first, second, and unwrapped third data points. For example, exemplary inputs can be represented as follows:

[Data1, Data2, 0, . . . , 0, Data16, 0, . . . . 0], where Data1 represents a first data point from a first phase image data set, Data2 represents a second data point from a second phase image data set, and Data16 represents the fourth or unwrapped third data point of the third phase image data set. The string of zeros between Data2 and Data16, and after Data16 represents zero-padding and zero-filling, respectively. If, for example, an N-Point Fourier Transform with a size of N=128 were implemented, there would be one hundred and twenty-eight data points entered. With regard to the exemplary inputs shown above, if N=128, then the inputs would consist of the three phase data points (i.e., Data1, Data2, and Data16), thirteen zero-padding points, and one hundred and twelve zero filling points. If a more robust result were preferred, N=256, for example, could be implemented. That is, greater values of N will likely yield more robust results.

Referring back to FIG. 4, after inputting the data, the Fourier Transform is executed in the temporal direction at STEP 134. A spectrum shift in the temporal frequency domain will be found in the output of the Fourier Transform. Accordingly, the phase accumulation or rate of phase change is determined from the spectrum shift at STEP 136. Therefrom, the magnetic field map is generated at STEP 138. As with the embodiments described above, the magnetic field map generated at STEP 138 may be generated point-by-point. Accordingly, the Fourier Transform may be executed for each set of data points that correspond with a particular location in the ROI.

In one embodiment, the determination of magnetic field map at STEP 138 can be achieved by utilizing the following relationship:

$$\Delta B = (n\_pixels\_shift/N)/(\gamma \cdot \Delta TE) \quad \text{(Eqn. 3)},$$

where N, as discussed above, is the Fourier Transform size. The larger the Fourier Transform size, the more robust the magnetic field map will be. The symbol gamma, $\gamma$, represents the gyromagnetic ratio physical constant that relates the Larmor frequency to the magnetic field. For hydrogen nuclei, it is well known that gamma is substantially equal to 4258 Hz/Gauss. The term "n_pixels_shift" refers to the spectrum shift determined from the output of the N-Point Fourier Transform. The change in the magnetic field thus determines the magnetic inhomogeneity at the location in the ROI. As such, the magnetic field map can be generated, point-by-point, therefrom.

While the embodiments described herein describe field map generation using three data points from three successive phase images, it is contemplated that additional data points from additional phase images could used in a manner consistent with the invention. That is, in addition to the acquisition of the three successive phase images as described herein, additional phase images, which may or may not contain phase wrapped data, could be acquired.

A technical contribution for the disclosed method and apparatus is that it provides for processor implemented three-point magnetic field map generation.

In accordance with one embodiment, an MR imaging apparatus includes a magnetic resonance imaging (MRI) system having a plurality of gradient coils positioned about a bore of a magnet, an RF transceiver system and an RF switch controlled by a pulse module to transmit RF signals to an RF coil assembly to acquire MR images, and a computer. The computer is programmed to acquire a first data point at a first location in a first phase image data set, a second data point at the first location in a second phase image data set, a third data point at the first location in a third phase image data set. The first phase image data set is acquired at a first echo time (TE). The second phase image data set is acquired at a second TE such that phase wrapping does not occur among the first and second phase image data sets. The third phase image data set, however, is acquired at a third TE such that phase wrapping occurs among the second and third phase image data sets. The computer is also programmed to determine a magnetic field inhomogeneity, wherein the determination of the magnetic field inhomogeneity is based on the first, second, and third data points.

In accordance with another embodiment, computer readable storage medium having stored thereon a computer program comprising instructions which when executed by a computer cause the computer to locate a first point in a first phase image, a second point in a second phase image, and a third point in a third phase image. The first phase image was acquired using a first TE, the second phase image was acquired using a second TE, and the third phase image was acquired using a third TE. The first, second, and third point locations are substantially equal. In addition, there is no phase wrapping between the first and second phase images. However, there is phase wrapping in the third phase image. The computer readable storage medium has further instructions to cause the computer to determine, and store in computer memory, a magnetic field inhomogeneity of a point in a region of interest that corresponds with the first, second, and third point locations.

In accordance with yet another embodiment, a method of determining phase accumulation among magnetic resonance phase images includes acquiring a first phase image using a first TE time and a second phase image at a second TE such that a first phase accumulation between the first and second phase images is greater than or equal to negative π and less than π. The method further includes the step of acquiring a third phase image at a third TE such that a second phase accumulation between the second and third phase images is one of greater than or equal to π and less than negative π. The method also includes locating a first point from the first phase image, a second point from the second phase image, a third point from the third phase image, each substantially in a same location, and generating a magnetic field map based on a cumulative phase accumulation over the first and second phase images and an unwrapped third phase image.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
    a magnetic resonance imaging (MRI) system having a plurality of gradient coils positioned about a bore of a magnet, and
    an RF transceiver system and an RF switch controlled by a pulse module configured to transmit RF signals to an RF coil assembly in order to acquire MR images; and
    a computer having a non-transitory computer readable medium programmed to:
        acquire a first data point at a first location in a first phase image data set, wherein the first phase image data set is acquired at a first echo time (TE);
        acquire a second data point at the first location in a second phase image data set, wherein the second phase image data set is acquired at a second TE larger than the first TE such that phase wrapping does not occur between the first and second phase image data sets;
        acquire a third data point at the first location in a third phase image data set, wherein the third phase image data set is acquired at a third TE larger than the second TE such that phase wrapping occurs between the second and third phase image data sets; and
        determine a magnetic field inhomogeneity, wherein the determination of the magnetic field inhomogeneity is based on a phase of the first, second, and third data points at the first location.

2. The MRI apparatus of claim 1 wherein the first, second, and third phase image data sets are consecutive phase image data sets.

3. The MRI apparatus of claim 1 wherein the computer is further programmed to determine a first phase accumulation between the first and second data points.

4. The MRI apparatus of claim 3 wherein the computer is further programmed to determine a phase of the third data point; wherein the phase of the third data point is wrapped relative to the second data point.

5. The MRI apparatus of claim 4 wherein the computer is further programmed to calculate an unwrapped phase of the third point based on the wrapped phase of the third data point and the first phase accumulation between the first and second data points in order to determine a fourth data point.

6. The MRI apparatus of claim 5 wherein the computer is further programmed to determine a slope among the first, second, and fourth data points.

7. The MRI apparatus of claim 6 wherein determining the slope comprises the determining one of:
    (A) a best fit line among the first, second, and fourth data points;
    (B) a line generally connecting the first data point and the fourth data point; and
    (C) a line generally connecting the second data point and the fourth data point.

8. The MRI apparatus of claim 6 wherein the computer is further programmed to determine a magnetic field inhomogeneity of a region of interest.

9. The MRI apparatus of claim 5 wherein the computer is further programmed to determine a second phase accumulation based on a spectrum shift resulting from an N-point Fourier Transform applied in a temporal direction over the first, second, and fourth data points; wherein N is an integer greater than 1.

10. The MRI apparatus of claim 9 wherein the computer is further programmed to determine the magnetic field inhomogeneity based on the second phase accumulation.

11. A non-transitory computer readable storage medium having stored thereon a computer program comprising instructions which when executed by a computer cause the computer to:
    locate a first point in a first magnetic resonance (MR) phase image acquired using a first echo time, $TE_1$; locate a second point in a second MR phase image acquired using a second echo time, $TE_2$, such that the location of the second point in the second MR phase image and the location of the first point in the first MR phase image are substantially equal, wherein there is no phase wrapping between the first and second MR phase images, wherein $TE_2$ is greater than $TE_{,1}$;
    locate a third point in a third MR phase image acquired using a third echo time, $TE_3$, such that the location of the third point in the third MR phase image and the location of the second point in the second MR phase image are substantially equal, wherein there is phase wrapping between the second and third MR phase images, wherein $TE_3$ is greater than $TE_2$;
    determine a magnetic field inhomogeneity of a point in an MR region of interest that corresponds with a phase of the first, second, and third point locations; and store the magnetic field inhomogeneity in computer memory.

12. The non-transitory computer readable storage medium of claim 11 wherein the locations of the first, second, and third point determine a first phase, a second phase, and a wrapped third phase, respectively.

13. The non-transitory computer readable storage medium of claim 12 having further instructions to cause the computer to determine a first change in phase between the first and second phases.

14. The non-transitory computer readable storage medium of claim 13 having further instructions to cause the computer to determine an unwrapped third phase from the first change in phase.

15. The non-transitory computer readable storage medium of claim 14 having further instructions to cause the computer to determine a rate of phase change among the first, second, and unwrapped third phases.

16. The non-transitory computer readable storage medium of claim 15 having further instructions to cause the computer to generate a magnetic field map of the region of interest based in part on the rate of phase change.

17. The non-transitory computer readable storage medium of claim 14 having further instruction to cause the computer to:

input data into an N-point Fourier Transform, wherein the data comprises first, second, and unwrapped third phase information; and execute the N-point Fourier Transform in a temporal direction to determine a spectrum shift.

18. The non-transitory computer readable storage medium of claim 17 wherein the determination of the magnetic field inhomogeneity is based on the spectrum shift.

19. A method of determining phase accumulation among a series of magnetic resonance phase images comprising:

acquiring a first phase image using a first echo time (TE) time;

acquiring a second phase image using a second TE, wherein a first phase accumulation between the first and second phase images is greater than or equal to negative $\pi$ and less than $\pi$, and wherein the second TE is larger than the first TE;

acquiring a third phase image at a third TE, wherein a second phase accumulation between the second and third phase images is one of a) greater than or equal to $\pi$, and b) less than negative $\pi$, and wherein the third TE is larger than the second TE; unwrapping the third phase image;

locating a first point in the first phase image, a second point in the second phase image, and a third point in the unwrapped third phase image that are in a same location; and generating a magnetic field inhomogeneity map based on a cumulative phase accumulation over the first and second phase images and the unwrapped third phase image based on the first, second, and third points.

20. The method of claim 19 wherein unwrapping the third phase image comprises unwrapping the third phase image by using the first phase accumulation.

21. The method of claim 20 further comprising determining the cumulative phase accumulation based on a rate of phase change among the first, second, and third points.

22. The method of claim 20 further comprising Fourier transforming in a temporal direction the first, second, and third points.

* * * * *